United States Patent
Collin

(10) Patent No.: US 11,531,200 B2
(45) Date of Patent: Dec. 20, 2022

(54) DISPLAY DEVICE AND SYSTEM

(71) Applicant: Dualitas Ltd, Milton Keynes (GB)

(72) Inventor: Stig Mikael Collin, Milton Keynes (GB)

(73) Assignee: DUALITAS LTD, Milton Keynes (GB)

( * ) Notice: Subject to any disclaimer, the term of this patent is extended or adjusted under 35 U.S.C. 154(b) by 0 days.

(21) Appl. No.: 17/217,290

(22) Filed: Mar. 30, 2021

(65) Prior Publication Data

US 2021/0373332 A1     Dec. 2, 2021

(30) Foreign Application Priority Data

Jun. 2, 2020    (GB) .................................. 2008298

(51) Int. Cl.
     *G02B 27/01*      (2006.01)
     *H04N 9/31*      (2006.01)

(52) U.S. Cl.
     CPC ......... *G02B 27/0103* (2013.01); *H04N 9/312* (2013.01); *H04N 9/3179* (2013.01); *G02B 2027/014* (2013.01)

(58) Field of Classification Search
CPC ... G02B 27/0103; H04N 9/312; H04N 9/3179
USPC .......................... 345/7; 712/19; 382/303, 257
See application file for complete search history.

(56) References Cited

U.S. PATENT DOCUMENTS

| | | | | |
|---|---|---|---|---|
| 4,395,699 A | * | 7/1983 | Sternberg | ................. G06T 5/20 382/257 |
| 4,790,026 A | * | 12/1988 | Gennery | ............ G06F 15/17343 382/303 |
| 5,434,967 A | | 7/1995 | Tannenbaum et al. | |
| 5,937,202 A | * | 8/1999 | Crosetto | ............... G06F 15/803 712/19 |
| 9,864,005 B1 | | 1/2018 | Carmean et al. | |
| 2004/0158599 A1 | | 8/2004 | Kwon | |

(Continued)

FOREIGN PATENT DOCUMENTS

JP      2018-200813 A      12/2018

OTHER PUBLICATIONS

Tomoyoshi Shimobaba An efficient computational method suitable for hardware of computer-generated hologram with phase computation by addition 2001 Computer Physics Communications 138 vol. 1, pp. 44-52.*

(Continued)

*Primary Examiner* — Prabodh M Dharia
(74) *Attorney, Agent, or Firm* — McDonnell Boehnen Hulbert & Berghoff LLP

(57) ABSTRACT

A logic circuit that can output a stream of sequential values, representing pixel position values, for a pixelated display device such as a spatial light modulator. The logic circuit may comprise an advanced integrated circuit such as a field-programmable gate array (FPGA) or an application-specific integrated circuit (ASIC). The stream of sequential values that is output by the logic circuit can be used by another logic circuit to calculate corresponding values of a software function, for populating those pixels of the pixelated display device. The software function can be, for example, a lens function or a grating function, which might be combined with a hologram, such as a computer-generated hologram (CGH), for display on the pixelated display device.

16 Claims, 8 Drawing Sheets

(56) References Cited

U.S. PATENT DOCUMENTS

2009/0083355 A1    3/2009  Takemori
2011/0066673 A1    3/2011  Outlaw
2011/0096145 A1    4/2011  Schwerdtner

OTHER PUBLICATIONS

UKIPO Combined Search and Examination Report under Sections 17 and 18(3) for GB Application 2008298.8, dated Dec. 2, 2020, 5 pages.

* cited by examiner

| Cycle Number | 1 | 2 | 3 | 4 | 5 | 6 | 7 | 8 |
|---|---|---|---|---|---|---|---|---|
| Input | 000 | 001 | 010 | 011 | 100 | 101 | 110 | 111 |
| Outputs | 00000 | 00100 | 01000 | 01100 | 10000 | 10100 | 11000 | 11100 |
| | 00001 | 00101 | 01001 | 01101 | 10001 | 10101 | 11001 | 11101 |
| | 00010 | 00110 | 01010 | 01110 | 10010 | 10110 | 11010 | 11110 |
| | 00011 | 00111 | 01011 | 01111 | 10011 | 10111 | 11011 | 11111 |

FIGURE 6

DISPLAY DEVICE AND SYSTEM

CROSS-REFERENCE TO RELATED APPLICATIONS

This application claims the benefit of priority of United Kingdom Patent Application no. 2008298.8, filed Jun. 2, 2020, which is hereby incorporated herein by reference in its entirety.

FIELD

The present disclosure relates to a projector. More specifically, the present disclosure relates to a holographic projector, a method of holographic projection and holographic projection system. Some embodiments relate to a head-up display. Some embodiments relate to a circuit for providing a stream of pixel position values for calculation of corresponding software function values, for display on pixels of a display device and a corresponding method.

BACKGROUND AND INTRODUCTION

Light scattered from an object contains both amplitude and phase information. This amplitude and phase information can be captured on, for example, a photosensitive plate by well-known interference techniques to form a holographic recording, or "hologram", comprising interference fringes. The hologram may be reconstructed by illumination with suitable light to form a two-dimensional or three-dimensional holographic reconstruction, or replay image, representative of the original object.

Computer-generated holography may numerically simulate the interference process. A computer-generated hologram may be calculated by a technique based on a mathematical transformation such as a Fresnel or Fourier transform. These types of holograms may be referred to as Fresnel/Fourier transform holograms or simply Fresnel/Fourier holograms. A Fourier hologram may be considered a Fourier domain/plane representation of the object or a frequency domain/plane representation of the object. A computer-generated hologram may also be calculated by coherent ray tracing or a point cloud technique, for example.

A computer-generated hologram may be encoded on a spatial light modulator arranged to modulate the amplitude and/or phase of incident light. Light modulation may be achieved using electrically-addressable liquid crystals, optically-addressable liquid crystals or micro-mirrors, for example.

A spatial light modulator typically comprises a plurality of individually-addressable pixels which may also be referred to as cells or elements. The light modulation scheme may be binary, multilevel or continuous. Alternatively, the device may be continuous (i.e. is not comprised of pixels) and light modulation may therefore be continuous across the device. The spatial light modulator may be reflective meaning that modulated light is output in reflection. The spatial light modulator may equally be transmissive meaning that modulated light is output in transmission.

A holographic projector may be provided using the system described herein. Such projectors have found application in head-up displays, "HUD", for example.

SUMMARY

Aspects of the present disclosure are defined in the appended independent claims.

In general terms, a logic circuit is provided herein that can output a stream of sequential values, representing pixel position values, for a pixelated display device such as a spatial light modulator. The logic circuit may comprise (or may be a logic block of or a sub-circuit of) an advanced integrated circuit such as a field-programmable gate array (FPGA) or an application-specific integrated circuit (ASIC). The stream of sequential values that is output by the logic circuit, according to this disclosure, can be used by another logic circuit (or other sub-circuit or logic device or processor) to calculate corresponding values of a software function, for populating those pixels of the pixelated display device. The software function can be, for example, a lens function or a grating function, which might be combined with a hologram, such as a computer-generated hologram (CGH), for display on the pixelated display device.

Advanced integrated circuits, such as the field-programmable gate array (FPGA), are optimised to perform complex logic functions and combinational functions but the logic blocks of these circuits can be very demanding of resources when performing simple functions. Moreover, there is an ever-present demand, in this field, for enhanced efficiency, in terms of the number of components that are required and in terms of the number and complexity of computation(s) that each component (and/or each logic block) must perform, in order to provide a particular output.

The present disclosure provides a logic circuit—particularly suitable for implementation in a field-programmable gate array or similar programmable or custom logic device—that reduces the number of components that are required, to provide each value of a stream of pixel position values for a display device, wherein the pixel position values can be used for calculating corresponding software function values for a software function, such as a software lens or a grating, for display on a pixelated display device such as a spatial light modulator (SLM). Moreover, the logic circuit can provide the stream of pixel position values at high speed, to satisfy the demands of the pixelated display device, and to ensure that its speed of operation is not hindered.

In particular, the logic circuit disclosed herein uses a single (i.e. one) unity addition module (or unity addition unit) in combination with a plurality of (i.e. two or more) pipeline modules, in order to provide plurality of outputs for every operational cycle of (i.e. for every number generated by) the unity addition module. The number of pipeline modules determines the number of outputs that can be provided, per operational cycle of the unity addition module. Therefore, the unity addition module can generate numbers more slowly than the rate at which a pixelated display device demands pixel position values (or demands the software function values calculated from pixel position values), with the operational rate of the unity addition module effectively being 'scaled up' by a factor that is equal to the number of pipeline modules that are present in the logic circuit.

The operation of the logic circuit harnesses the properties of binary (i.e. base 2) numbers. It embodies a recognition, by the present inventors that, if the pipeline modules are assigned unique sequential identity values, represented in binary form, then each of those unique sequential identity values may be appended to a single (i.e. to the same) multi-bit binary number, input to the pipeline modules by the unity addition module, in order to output a corresponding plurality of unique sequential multi-bit binary outputs. Those unique sequential multi-bit binary outputs can be used to represent pixel position values, for use in calculation of corresponding software function values.

Moreover, the present inventors have recognised that if, in an immediately subsequent operational cycle, the unity addition module inputs a multi-bit binary number to the pipeline modules, which is one (i.e. 1) greater than the immediately previously-input multi-bit binary number, and if the pipelines again append their unique sequential identity values thereto; the resultant multi-bit binary outputs will comprise a sequential stream of values that follows on sequentially from the multi-bit binary outputs that were output by the pipeline modules for the immediately preceding cycle. The logic circuit can therefore output a sequential stream of values, producing those values in groups, on a cyclical basis.

According to an aspect, a logic circuit is provided, wherein the logic circuit is arranged to output a stream of pixel position values, x, for a row of a pixelated display device, for calculation of corresponding software function values F(x), for display on [m×n] pixels of the pixelated display device; wherein the stream comprises sequential numbers from 0 to (n−1). The logic circuit comprises a unity addition module and a plurality, p, of pipeline modules, wherein the pipeline modules have respective individual pipeline identity values, v, from v=0 to v=(p−1). The unity addition module is arranged to provide a multi-bit binary input, i, to each of the plurality, p, of pipeline modules, in common, during a pre-defined time cycle. Each pipeline module is arranged, for the pre-defined time cycle, to: receive the multi-bit binary input, i, from the unity addition module; append a binary representation of its individual pipeline identity value, v, to the received multi-bit binary input, i; and to output a unique multi-bit binary output, $o_v$, that comprises a combination of the received multi-bit binary input, i, and the binary representation of its individual pipeline identity value, v.

The unity addition module may itself comprise a logic circuit. For example, it may comprise a plurality of logic gates, for example a combination of OR, XOR, and AND logic gates, arranged in a particular way to provide unity addition. The unity addition module may be referred to as an 'adder', an 'addition unit', an 'adder unit', or an 'add operator'.

The term 'pipeline module' will be familiar to the skilled reader. A pipeline module may comprise an independent electrical conduit, arranged for data signals and/or numbering processing.

The pre-defined time cycle of the logic circuit of the present aspect may be referred to as its 'clock cycle'.

The [m×n] pixels of the pixelated display device may be formed from 'm' rows and 'n' columns, wherein 'm' and 'n' are whole, positive integers. In such a case, there will be 'n' pixels in every row and 'm' pixels in every column of the pixelated display device. The logic circuit may therefore be arranged to output a stream of 'n' sequential pixel position values for a row, wherein the individual pixel values begin at 0 (at the $1^{st}$ pixel of the row) and increase in whole integer steps to 'n−1' (at the $n^{th}$ pixel of the row).

The individual pipeline identity values, v, from v=0 to v=(p−1) may comprise sequential whole positive integers, which can be represented by respective binary (i.e. base 2) numbers.

The term 'in common', as used in this context, may be regarded as meaning that the unity addition module is arranged to provide the same (i.e. a single) multi-bit binary input, i, to each of (i.e. to all of) the pipeline modules, for a pre-defined time cycle. Therefore, the unity additional module may need to only provide one multi-bit binary input, i, per pre-defined time cycle. The same (single) multi-bit binary input, i, may be used by every pipeline module, during a pre-defined time cycle, in order to produce a corresponding plurality of multi-bit binary outputs, $o_v$.

The logic circuit of the present aspect may be arranged to output a stream of pixel position values, x, for more than one row of a pixelated display device, for calculation of corresponding software function values F(x), for display on [m×n] pixels of the pixelated display device. The logic circuit may be arranged to output a stream of pixel position values, x, for every row of a pixelated display device, for calculation of corresponding software function values F(x), for display on [m×n] pixels of the pixelated display device.

The length (in units of time) of the pre-defined time cycle of the logic circuit of the present aspect may be equal to the length (in units of time) of a 'clock cycle' or of an 'operational cycle' of the unity addition module.

Each pipeline module may be arranged to, for each pre-defined time cycle of the logic circuit, append a multi-bit binary representation of its individual pipeline identity value, v, to the received multi-bit binary input, i. The binary representation of its individual pipeline identity value, v, as output by each pipeline module, may have the same number of bits as the binary representation of its individual pipeline identity value, v, which each of the respective other pipeline modules outputs. The unique multi-bit binary output, $o_v$, that each pipeline is arranged to output may be longer, in terms of number of bits, than the multi-bit binary input, i, which the pipeline modules have received from the unity addition module.

The logic circuit of the present aspect may be arranged to provide its outputs to a second, different logic circuit. The second, different logic circuit may be comprised within the same logic device as the logic circuit of the present aspect. For example, the second, different logic circuit may be comprised within the same advanced integrated circuit, such as an FPGA, as the logic circuit of the present aspect. The second, different logic circuit may be regarded a next, or subsequent, processing block of the FPGA, before an output is provided to the pixelated display device. The second, different logic circuit may be arranged to use the sequential pixel values output by the logic circuit of the present aspect, and to calculate the corresponding software function values F(x), for display on [m×n] pixels of the pixelated display device.

The second, different logic circuit may have a clock cycle that is equal to the pre-defined time cycle of the logic circuit of the present aspect. The logic circuit of the present aspect and the second, different circuit may have a common clock. The second, different logic circuit may be arranged to output its calculated software function values F(x), for display on [m×n] pixels of the pixelated display device, at a rate which meets a demand of the pixelated display device. The second, different logic circuit may comprise a plurality of software lens value calculation blocks, that are arranged to work in parallel with one another. For example, each software lens value calculation block of the second, different logic circuit may be configured to receive a value from a corresponding pipeline module (comprised within the logic circuit of the present aspect) and to use that received value to output a corresponding software lens value. Each software lens value calculation block, within the second, different logic circuit, may be arranged to receive its respective value from the corresponding pipeline module and to output its respective software lens value at substantially the same times as each of the other software lens value calculation blocks receives its respective value from the corresponding pipeline module and outputs its respective software lens value. Therefore, a plurality of software lens values may be provided to the pixelated display device, for each pre-defined time cycle. The plurality of software lens values may be provided in a substantially simultaneous group, for each pre-defined time cycle.

The logic circuit of the present aspect may have a common clock, with the pixelated display device. That is; a 'clock cycle' of the pixelated display device may be equal (in units of time) to the pre-defined time cycle or 'clock cycle' of the logic circuit of the present aspect.

The unique multi-bit binary output, $o_v$, from a pipeline module, for a pre-defined time cycle, may comprise the received multi-bit binary input, i, as its most significant bits and the binary representation of the pipeline's individual pipeline identity value, v, as its least significant bit(s). In other words; the received multi-bit binary input, i, may appear at the beginning of the unique multi-bit binary output, $o_v$, from a pipeline module, for a pre-defined time cycle, and the binary representation of that pipeline's individual pipeline identity value, v, may appear at the end, following on immediately from the received multi-bit binary input, i.

The unity addition module may be arranged to provide a first multi-bit binary input $i_1$ to each of the plurality, p, of pipeline modules during a first pre-defined time cycle and to provide a second multi-bit binary input $i_2$ to each of the plurality, p, of pipeline modules during a second pre-defined time cycle, immediately subsequent the first time cycle; wherein the second multi-bit binary input $i_2$ is greater than the first multi-bit binary input $i_1$ by a single integer (i.e. by 1).

The logic circuit may be arranged to repeat its operations, on a cyclical basis. In other words; the operations performed by the unity addition module and the pipeline modules, during a pre-defined time cycle according to this aspect, may be repeated a plurality of times, during a corresponding plurality of pre-defined time cycles, one after another. For each pre-defined time cycle, the value of the multi-bit binary input, i, which the pipeline modules receive from the unity addition module, may increase by one (1), as compared to the immediately-preceding pre-defined time cycle. A suitable controller may be provided, for controlling the operation of the unity addition module, and/or of the logic circuit. For example, a controller may be configured to reset the numbers provided by the unity addition module to zero (0), under certain conditions.

The logic circuit may be arranged to perform a pre-determined number of repetitions of its operations, or to keep repeating its operations for a pre-determined length of time, or to keep repeating its operations until a pre-determined goal or threshold has been reached or exceeded, or to follow another instruction as regards when to start and stop its operations.

There may be a correlation between the number of pipeline modules in the plurality, p, of pipeline modules and a number of pixel values that the pixelated display device 'demands' (i.e. needs to be furnished with) per unit time.

The logic circuit may be arranged to output a stream of pixel position values, x, for a row of a pixelated display device that demands a pre-determined number, k, of pixel values per pre-defined time cycle, wherein k is a factor of the number of pipeline modules comprised within the plurality, p, of pipeline modules. In this context, the term 'factor' may be regarded as meaning a mathematical factor, such that the value of k may be multiplied by a whole (positive) number to produce the value of p. For example, p may be equal to k or it may be double k, and so on.

There may be a correlation between the length (in units of time) of the pre-defined time cycle (or 'clock cycle') of the logic circuit and the number of pipeline modules in the plurality, p, of pipeline modules, as compared to a demand of the pixelated display device. The demand of the pixelated display device may be regarded as being the number of pixel values that the pixelated display device 'demands' (i.e. needs to be furnished with) per unit time, or per 'clock cycle'. As mentioned above, the clock cycle of the pixelated display device may be the same as the clock cycle (ore pre-defined time cycle) of the logic circuit. The logic circuit may be arranged to meet that demand, by providing a plurality of outputs from a corresponding plurality, p, of pipeline modules, per pre-defined time cycle. If the logic circuit operates relatively slowly, such that the length (in units of time) of the pre-defined time cycle of the logic circuit is relatively long, then more pipeline modules will be needed to meet the demands of the pixelated display device, per unit time. Conversely, if the logic circuit operates relatively quickly, such that the pre-defined time cycle is relatively short, then fewer pipeline modules will be needed to meet the demands of the pixelated display device, per unit time.

The logic circuit may be arranged to provide as many pixel values per unit time as are demanded by the pixelated display device. However, in some cases, the logic circuit may be arranged to provide fewer pixel values per unit time than are (or than could be) demanded by the pixelated display device.

Each of the plurality, p, of pipeline modules may be arranged to output its unique multi-bit binary output, $o_v$, for a pre-defined time cycle at substantially the same time as each of the respective other pipeline modules. Therefore, the logic circuit may be arranged to output a plurality, p, of outputs at substantially the same time. Each of those outputs may comprise a multi-bit binary representation of a respective pixel position value, x, for a row of a pixelated display device. The plurality of multi-bit binary representations of respective pixel position values, x, which are output at a given time (for example, at the end of a pre-defined time cycle), by the logic circuit may comprise sequential pixel position values.

The pixelated display device may be arranged to display a light modulation pattern comprising the software function values F(x). The pixelated display device may comprise a spatial light modulator.

The software function values F(x), for display on [m×n] pixels of a pixelated display device, may comprise values of a lens function or a grating function.

The lens function or grating function may be provided for display in combination with a hologram on a pixelated display device.

According to an aspect, a logic device is provided, comprising the logic circuit according to any of the above-described aspects, wherein the device comprises an application specific integrated circuit, ASIC, or a programmable logic device, PLD.

The logic device may comprise a field programmable gate array, FPGA.

The logic device may comprise more than one logic circuit according to any of the above-described aspects.

According to an aspect, a holographic projector is provided comprising: a logic device according to an above aspect; a pixelated display device arranged to display a light modulation pattern comprising the software function values F(x), calculated in accordance with the stream of pixel position values, x; and a light source arranged to illuminate the light modulation pattern with light having a wavelength, λ.

The logic device within the holographic projector may be further arranged to add the software function values F(x), calculated in accordance with the stream of pixel position values, x, to hologram pixel values of a stream of hologram pixel values to form a data stream of display values, wherein the light modulation pattern is formed in accordance with the stream of display values provided to the pixelated display device by the logic device.

According to an aspect, a head-up display may be provided, comprising the holographic projector of an above aspect.

According to an aspect, a method is provided of streaming pixel position values, x, for a row of a pixelated display device, for calculation of corresponding software function values F(x), for display on [m×n] pixels of the pixelated display device, wherein the stream comprises sequential numbers from 0 to (n−1). The method comprises providing a multi-bit binary input, i, to each of a plurality, p, of pipeline modules, in common, during a pre-defined time cycle, wherein the pipeline modules have respective individual pipeline identity values, v, from v=0 to v=(p−1). The method further comprises, at each of the plurality, p, of pipeline modules, for the pre-defined time cycle: receiving the multi-bit binary input, i; appending a binary representation of its individual pipeline identity value, v, to the received multi-bit binary input, i; and outputting a unique multi-bit binary output, $o_v$, that comprises a combination of the received multi-bit binary input, i, and the binary representation of its individual pipeline identity value, v.

The method may further comprise receiving the unique multi-bit binary outputs, $o_r$, from each of the pipeline modules in the plurality, p, of pipeline modules, and using the received unique multi-bit binary outputs, $o_r$, as pixel position values, x, for a row of a pixelated display device, for use in calculation of corresponding software function values F(x), for display on [m×n] pixels of a pixelated display device.

According to an aspect, a logic circuit is provided, wherein the logic circuit is arranged to output a stream of pixel position values, x, for a row or a column of a pixelated display device, for calculation of corresponding software function values F(x), for display on [m×n] pixels of the pixelated display device; wherein the stream comprises sequential numbers from 0 to (n−1), if the pixel position values are for a row; or wherein the stream comprises sequential numbers from 0 to (m−1), if the pixel position values are for a column. The logic circuit comprises a unity addition module and a plurality, p, of pipeline modules, wherein the pipeline modules have respective individual pipeline identity values, v, from v=0 to v=(p−1). The unity addition module is arranged to provide a multi-bit binary input, i, to each of the plurality, p, of pipeline modules, in common, during a pre-defined time cycle. Each pipeline module is arranged, for the pre-defined time cycle, to: receive the multi-bit binary input, i, from the unity addition module; append a binary representation of its individual pipeline identity value, v, to the received multi-bit binary input, i; and to output a unique multi-bit binary output, $o_v$, that comprises a combination of the received multi-bit binary input, i, and the binary representation of its individual pipeline identity value, v.

The [m×n] pixels of the pixelated display device may be formed from 'm' rows and 'n' columns, wherein 'm' and 'n' are whole, positive integers. In such a case, there will be 'n' pixels in every row and 'm' pixels in every column of the pixelated display device. The logic circuit may therefore be arranged to output a stream of 'n' sequential pixel position values for a row, wherein the individual pixel values begin at 0 (at the $1^{st}$ pixel of the row) and increase in whole integer steps to 'n−1' (at the $n^{th}$ pixel of the row). Alternatively or additionally, the logic circuit may be arranged to output a stream of 'm' sequential pixel position values for a column, wherein the individual pixel values begin at 0 (at the $1^{st}$ pixel of the column) and increase in whole integer steps to 'm−1' (at the $m^{th}$ pixel of the column).

The term "hologram" is used to refer to the recording which contains amplitude information or phase information, or some combination thereof, regarding the object. The term "holographic reconstruction" is used to refer to the optical reconstruction of the object which is formed by illuminating the hologram. The system disclosed herein is described as a "holographic projector" because the holographic reconstruction is a real image and spatially-separated from the hologram. The term "replay field" is used to refer to the 2D area within which the holographic reconstruction is formed and fully focused. If the hologram is displayed on a spatial light modulator comprising pixels, the replay field will be repeated in the form of a plurality diffracted orders wherein each diffracted order is a replica of the zeroth-order replay field. The zeroth-order replay field generally corresponds to the preferred or primary replay field because it is the brightest replay field. Unless explicitly stated otherwise, the term "replay field" should be taken as referring to the zeroth-order replay field. The term "replay plane" is used to refer to the plane in space containing all the replay fields. The terms "image", "replay image" and "image region" refer to areas of the replay field illuminated by light of the holographic reconstruction. In some embodiments, the "image" may comprise discrete spots which may be referred to as "image spots" or, for convenience only, "image pixels".

The terms "encoding", "writing" or "addressing" are used to describe the process of providing the plurality of pixels of the SLM with a respective plurality of control values which respectively determine the modulation level of each pixel. It may be said that the pixels of the SLM are configured to "display" a light modulation distribution in response to receiving the plurality of control values. Thus, the SLM may be said to "display" a hologram and the hologram may be considered an array of light modulation values or levels.

It has been found that a holographic reconstruction of acceptable quality can be formed from a "hologram" containing only phase information related to the Fourier transform of the original object. Such a holographic recording may be referred to as a phase-only hologram. Embodiments relate to a phase-only hologram but the present disclosure is equally applicable to amplitude-only holography.

The present disclosure is also equally applicable to forming a holographic reconstruction using amplitude and phase information related to the Fourier transform of the original object. In some embodiments, this is achieved by complex modulation using a so-called fully complex hologram which contains both amplitude and phase information related to the original object. Such a hologram may be referred to as a fully-complex hologram because the value (grey level) assigned to each pixel of the hologram has an amplitude and phase component. The value (grey level) assigned to each pixel may be represented as a complex number having both amplitude and phase components. In some embodiments, a fully-complex computer-generated hologram is calculated.

Reference may be made to the phase value, phase component, phase information or, simply, phase of pixels of the computer-generated hologram or the spatial light modulator as shorthand for "phase-delay". That is, any phase value described is, in fact, a number (e.g. in the range 0 to $2\pi$) which represents the amount of phase retardation provided by that pixel. For example, a pixel of the spatial light modulator described as having a phase value of $\pi/2$ will retard the phase of received light by $\pi/2$ radians. In some embodiments, each pixel of the spatial light modulator is operable in one of a plurality of possible modulation values (e.g. phase delay values). The term "grey level" may be used to refer to the plurality of available modulation levels. For example, the term "grey level" may be used for convenience to refer to the plurality of available phase levels in a phase-only modulator even though different phase levels do not provide different shades of grey. The term "grey level" may also be used for convenience to refer to the plurality of available complex modulation levels in a complex modulator.

The hologram therefore comprises an array of grey levels—that is, an array of light modulation values such as an array of phase-delay values or complex modulation values. The hologram is also considered a diffractive pattern because it is a pattern that causes diffraction when displayed on a spatial light modulator and illuminated with light having a wavelength comparable to, generally less than, the pixel pitch of the spatial light modulator. Reference is made herein to combining the hologram with other diffractive patterns such as diffractive patterns functioning as a lens or grating. For example, a diffractive pattern functioning as a grating may be combined with a hologram to translate the replay field on the replay plane or a diffractive pattern functioning as a lens may be combined with a hologram to focus the holographic reconstruction on a replay plane in the near field.

Although different embodiments and groups of embodiments may be disclosed separately in the detailed description which follows, any feature of any embodiment or group of embodiments may be combined with any other feature or combination of features of any embodiment or group of embodiments. That is, all possible combinations and permutations of features disclosed in the present disclosure are envisaged.

BRIEF DESCRIPTION OF THE DRAWINGS

Specific embodiments are described by way of example only with reference to the following figures:

FIG. 6 is a table showing possible inputs and outputs of the pipeline modules of FIG. 4.

The same reference numbers will be used throughout the drawings to refer to the same or like parts.

DETAILED DESCRIPTION OF EMBODIMENTS

The present invention is not restricted to the embodiments described in the following but extends to the full scope of the appended claims. That is, the present invention may be embodied in different forms and should not be construed as limited to the described embodiments, which are set out for the purpose of illustration.

Terms of a singular form may include plural forms unless specified otherwise.

A structure described as being formed at an upper portion/lower portion of another structure or on/under the other structure should be construed as including a case where the structures contact each other and, moreover, a case where a third structure is disposed there between.

In describing a time relationship—for example, when the temporal order of events is described as "after", "subsequent", "next", "before" or suchlike—the present disclosure should be taken to include continuous and non-continuous events unless otherwise specified. For example, the description should be taken to include a case which is not continuous unless wording such as "just", "immediate" or "direct" is used.

Although the terms "first", "second", etc. may be used herein to describe various elements, these elements are not to be limited by these terms. These terms are only used to distinguish one element from another. For example, a first element could be termed a second element, and, similarly, a second element could be termed a first element, without departing from the scope of the appended claims.

Features of different embodiments may be partially or overall coupled to or combined with each other, and may be variously inter-operated with each other. Some embodiments may be carried out independently from each other, or may be carried out together in co-dependent relationship.

Optical Configuration

Figure 1:
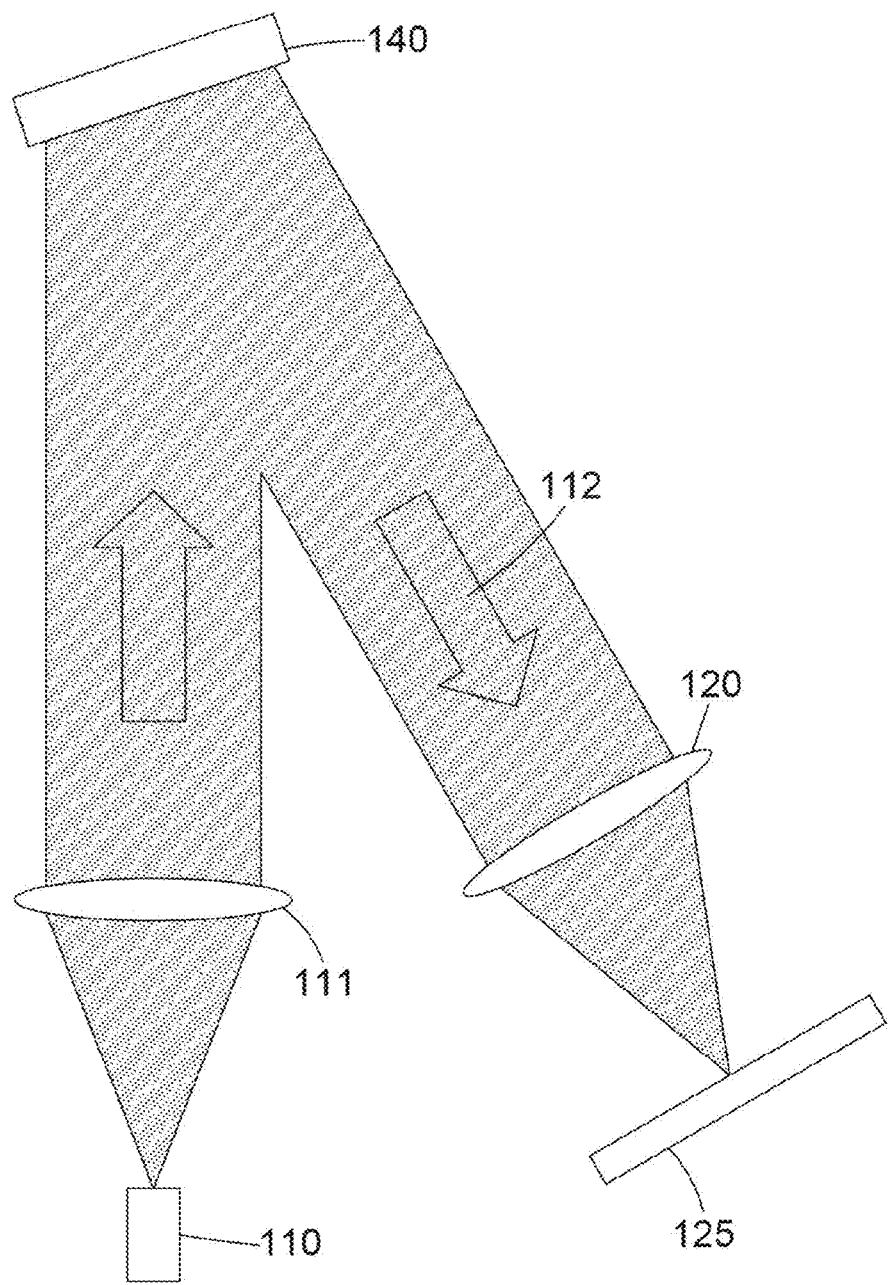
FIG. 1 is a schematic showing a reflective SLM producing a holographic reconstruction on a screen.

FIG. 1 shows an embodiment in which a computer-generated hologram is encoded on a single spatial light modulator. The computer-generated hologram is a Fourier transform of the object for reconstruction. It may therefore be said that the hologram is a Fourier domain or frequency domain or spectral domain representation of the object. In this embodiment, the spatial light modulator is a reflective liquid crystal on silicon, "LCOS", device. The hologram is encoded on the spatial light modulator and a holographic reconstruction is formed at a replay field, for example, a light receiving surface such as a screen or diffuser.

A light source 110, for example a laser or laser diode, is disposed to illuminate the SLM 140 via a collimating lens 111. The collimating lens causes a generally planar wavefront of light to be incident on the SLM. In FIG. 1, the direction of the wavefront is off-normal (e.g. two or three degrees away from being truly orthogonal to the plane of the transparent layer). However, in other embodiments, the generally planar wavefront is provided at normal incidence and a beam splitter arrangement is used to separate the input and output optical paths. In the embodiment shown in FIG. 1, the arrangement is such that light from the light source is reflected off a mirrored rear surface of the SLM and interacts with a light-modulating layer to form an exit wavefront 112. The exit wavefront 112 is applied to optics including a Fourier transform lens 120, having its focus at a screen 125. More specifically, the Fourier transform lens 120 receives a beam of modulated light from the SLM 140 and performs a frequency-space transformation to produce a holographic reconstruction at the screen 125.

Notably, in this type of holography, each pixel of the hologram contributes to the whole reconstruction. There is not a one-to-one correlation between specific points (or image pixels) on the replay field and specific light-modulating elements (or hologram pixels). In other words, modulated light exiting the light-modulating layer is distributed across the replay field.

In these embodiments, the position of the holographic reconstruction in space is determined by the dioptric (focusing) power of the Fourier transform lens. In the embodiment shown in FIG. 1, the Fourier transform lens is a physical lens. That is, the Fourier transform lens is an optical Fourier transform lens and the Fourier transform is performed optically. Any lens can act as a Fourier transform lens but the performance of the lens will limit the accuracy of the Fourier transform it performs. The skilled person understands how to use a lens to perform an optical Fourier transform.

Hologram Calculation

In some embodiments, the computer-generated hologram is a Fourier transform hologram, or simply a Fourier hologram or Fourier-based hologram, in which an image is reconstructed in the far field by utilising the Fourier transforming properties of a positive lens. The Fourier hologram is calculated by Fourier transforming the desired light field in the replay plane back to the lens plane. Computer-generated Fourier holograms may be calculated using Fourier transforms.

A Fourier transform hologram may be calculated using an algorithm such as the Gerchberg-Saxton algorithm. Furthermore, the Gerchberg-Saxton algorithm may be used to calculate a hologram in the Fourier domain (i.e. a Fourier transform hologram) from amplitude-only information in the spatial domain (such as a photograph). The phase information related to the object is effectively "retrieved" from the amplitude-only information in the spatial domain. In some embodiments, a computer-generated hologram is calculated from amplitude-only information using the Gerchberg-Saxton algorithm or a variation thereof.

The Gerchberg Saxton algorithm considers the situation when intensity cross-sections of a light beam, $I_A(x, y)$ and $I_B(x, y)$, in the planes A and B respectively, are known and $I_A(x, y)$ and $I_B(x, y)$ are related by a single Fourier transform. With the given intensity cross-sections, an approximation to the phase distribution in the planes A and B, $\Psi_A(x, y)$ and $\Psi_B(x, y)$ respectively, is found. The Gerchberg-Saxton algorithm finds solutions to this problem by following an iterative process. More specifically, the Gerchberg-Saxton algorithm iteratively applies spatial and spectral constraints while repeatedly transferring a data set (amplitude and phase), representative of $I_A(x, y)$ and $I_B(x, y)$, between the spatial domain and the Fourier (spectral or frequency) domain. The corresponding computer-generated hologram in the spectral domain is obtained through at least one iteration of the algorithm. The algorithm is convergent and arranged to produce a hologram representing an input image. The hologram may be an amplitude-only hologram, a phase-only hologram or a fully complex hologram.

In some embodiments, a phase-only hologram is calculated using an algorithm based on the Gerchberg-Saxton algorithm such as described in British patent 2,498,170 or 2,501,112 which are hereby incorporated in their entirety by reference. However, embodiments disclosed herein describe calculating a phase-only hologram by way of example only. In these embodiments, the Gerchberg-Saxton algorithm retrieves the phase information $\Psi[u, v]$ of the Fourier transform of the data set which gives rise to a known amplitude information $T[x, y]$, wherein the amplitude information $T[x, y]$ is representative of a target image (e.g. a photograph). Since the magnitude and phase are intrinsically combined in the Fourier transform, the transformed magnitude and phase contain useful information about the accuracy of the calculated data set. Thus, the algorithm may be used iteratively with feedback on both the amplitude and the phase information. However, in these embodiments, only the phase information $\Psi[u, v]$ is used as the hologram to form a holographic representative of the target image at an image plane. The hologram is a data set (e.g. 2D array) of phase values.

In other embodiments, an algorithm based on the Gerchberg-Saxton algorithm is used to calculate a fully-complex hologram. A fully-complex hologram is a hologram having a magnitude component and a phase component. The hologram is a data set (e.g. 2D array) comprising an array of complex data values wherein each complex data value comprises a magnitude component and a phase component.

In some embodiments, the algorithm processes complex data and the Fourier transforms are complex Fourier transforms. Complex data may be considered as comprising (i) a real component and an imaginary component or (ii) a magnitude component and a phase component. In some embodiments, the two components of the complex data are processed differently at various stages of the algorithm.

Figure 2A:
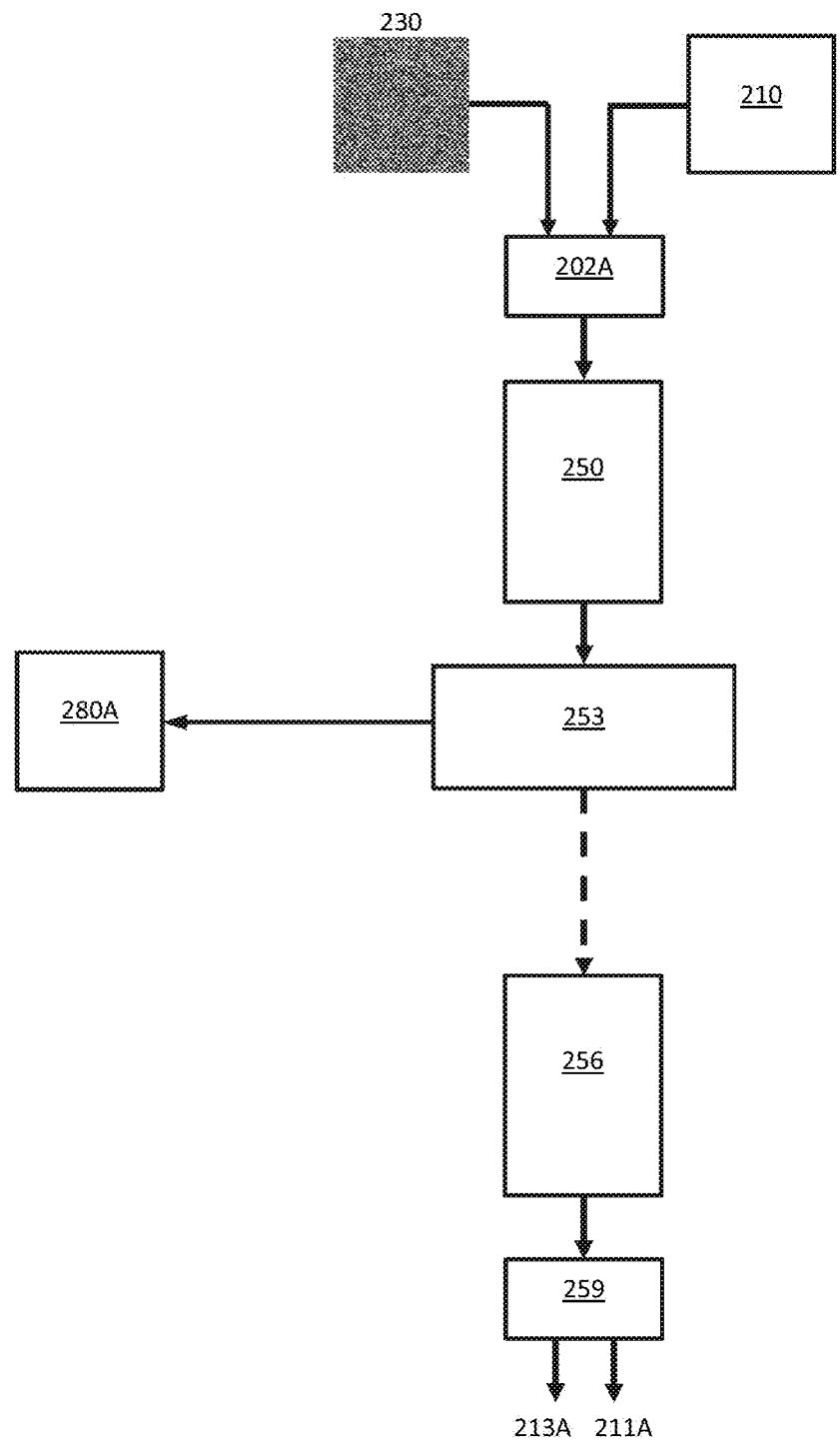
FIG. 2A illustrates a first iteration of an example Gerchberg-Saxton type algorithm.

FIG. 2A illustrates the first iteration of an algorithm in accordance with some embodiments for calculating a phase-only hologram. The input to the algorithm is an input image 210 comprising a 2D array of pixels or data values, wherein each pixel or data value is a magnitude, or amplitude, value. That is, each pixel or data value of the input image 210 does not have a phase component. The input image 210 may therefore be considered a magnitude-only or amplitude-only or intensity-only distribution. An example of such an input image 210 is a photograph or one frame of video comprising a temporal sequence of frames. The first iteration of the algorithm starts with a data forming step 202A comprising assigning a random phase value to each pixel of the input image, using a random phase distribution (or random phase seed) 230, to form a starting complex data set wherein each data element of the set comprising magnitude and phase. It may be said that the starting complex data set is representative of the input image in the spatial domain.

First processing block 250 receives the starting complex data set and performs a complex Fourier transform to form a Fourier transformed complex data set. Second processing block 253 receives the Fourier transformed complex data set and outputs a hologram 280A. In some embodiments, the hologram 280A is a phase-only hologram. In these embodiments, second processing block 253 quantiles each phase value and sets each amplitude value to unity in order to form hologram 280A. Each phase value is quantised in accordance with the phase-levels which may be represented on the pixels of the spatial light modulator which will be used to "display" the phase-only hologram. For example, if each pixel of the spatial light modulator provides 256 different phase levels, each phase value of the hologram is quantised into one phase level of the 256 possible phase levels. Hologram 280A is a phase-only Fourier hologram which is representative of an input image. In other embodiments, the hologram 280A is a fully complex hologram comprising an array of complex data values (each including an amplitude component and a phase component) derived from the received Fourier transformed complex data set. In some embodiments, second processing block 253 constrains each complex data value to one of a plurality of allowable complex modulation levels to form hologram 280A. The step of constraining may include setting each complex data value to the nearest allowable complex modulation level in the complex plane. It may be said that hologram 280A is representative of the input image in the spectral or Fourier or frequency domain. In some embodiments, the algorithm stops at this point.

However, in other embodiments, the algorithm continues as represented by the dotted arrow in FIG. 2A. In other words, the steps which follow the dotted arrow in FIG. 2A are optional (i.e. not essential to all embodiments).

Third processing block 256 receives the modified complex data set from the second processing block 253 and performs an inverse Fourier transform to form an inverse Fourier transformed complex data set. It may be said that the inverse Fourier transformed complex data set is representative of the input image in the spatial domain.

Fourth processing block 259 receives the inverse Fourier transformed complex data set and extracts the distribution of magnitude values 211A and the distribution of phase values 213A. Optionally, the fourth processing block 259 assesses the distribution of magnitude values 211A. Specifically, the fourth processing block 259 may compare the distribution of magnitude values 211A of the inverse Fourier transformed complex data set with the input image 510 which is itself, of course, a distribution of magnitude values. If the difference between the distribution of magnitude values 211A and the input image 210 is sufficiently small, the fourth processing block 259 may determine that the hologram 280A is acceptable. That is, if the difference between the distribution of magnitude values 211A and the input image 210 is sufficiently small, the fourth processing block 259 may determine that the hologram 280A is a sufficiently-accurate representative of the input image 210. In some embodiments, the distribution of phase values 213A of the inverse Fourier transformed complex data set is ignored for the purpose of the comparison. It will be appreciated that any number of different methods for comparing the distribution of magnitude values 211A and the input image 210 may be employed and the present disclosure is not limited to any particular method. In some embodiments, a mean square difference is calculated and if the mean square difference is less than a threshold value, the hologram 280A is deemed acceptable. If the fourth processing block 259 determines that the hologram 280A is not acceptable, a further iteration of the algorithm may be performed. However, this comparison step is not essential and in other embodiments, the number of iterations of the algorithm performed is predetermined or preset or user-defined.

Figure 2B:
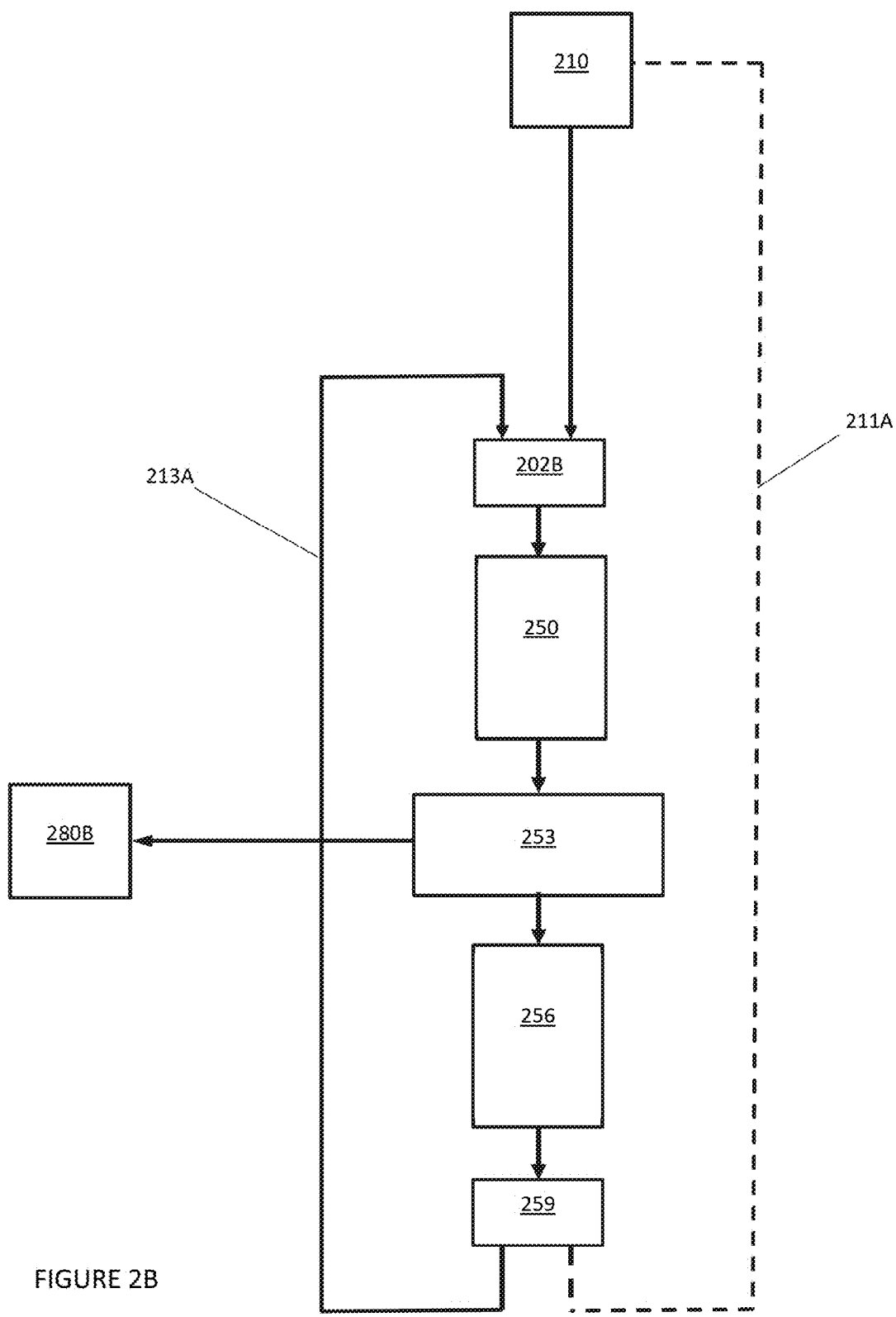
FIG. 2B illustrates the second and subsequent iterations of the example Gerchberg-Saxton type algorithm.

FIG. 2B represents a second iteration of the algorithm and any further iterations of the algorithm. The distribution of phase values 213A of the preceding iteration is fed-back through the processing blocks of the algorithm. The distribution of magnitude values 211A is rejected in favour of the distribution of magnitude values of the input image 210. In the first iteration, the data forming step 202A formed the first complex data set by combining distribution of magnitude values of the input image 210 with a random phase distribution 230. However, in the second and subsequent iterations, the data forming step 202B comprises forming a complex data set by combining (i) the distribution of phase values 213A from the previous iteration of the algorithm with (ii) the distribution of magnitude values of the input image 210.

The complex data set formed by the data forming step 202B of FIG. 2B is then processed in the same way described with reference to FIG. 2A to form second iteration hologram 280B. The explanation of the process is not therefore repeated here. The algorithm may stop when the second iteration hologram 280B has been calculated. However, any number of further iterations of the algorithm may be performed. It will be understood that the third processing block 256 is only required if the fourth processing block 259 is required or a further iteration is required. The output hologram 280B generally gets better with each iteration. However, in practice, a point is usually reached at which no measurable improvement is observed or the positive benefit of performing a further iteration is out-weighted by the negative effect of additional processing time. Hence, the algorithm is described as iterative and convergent.

Figure 2C:
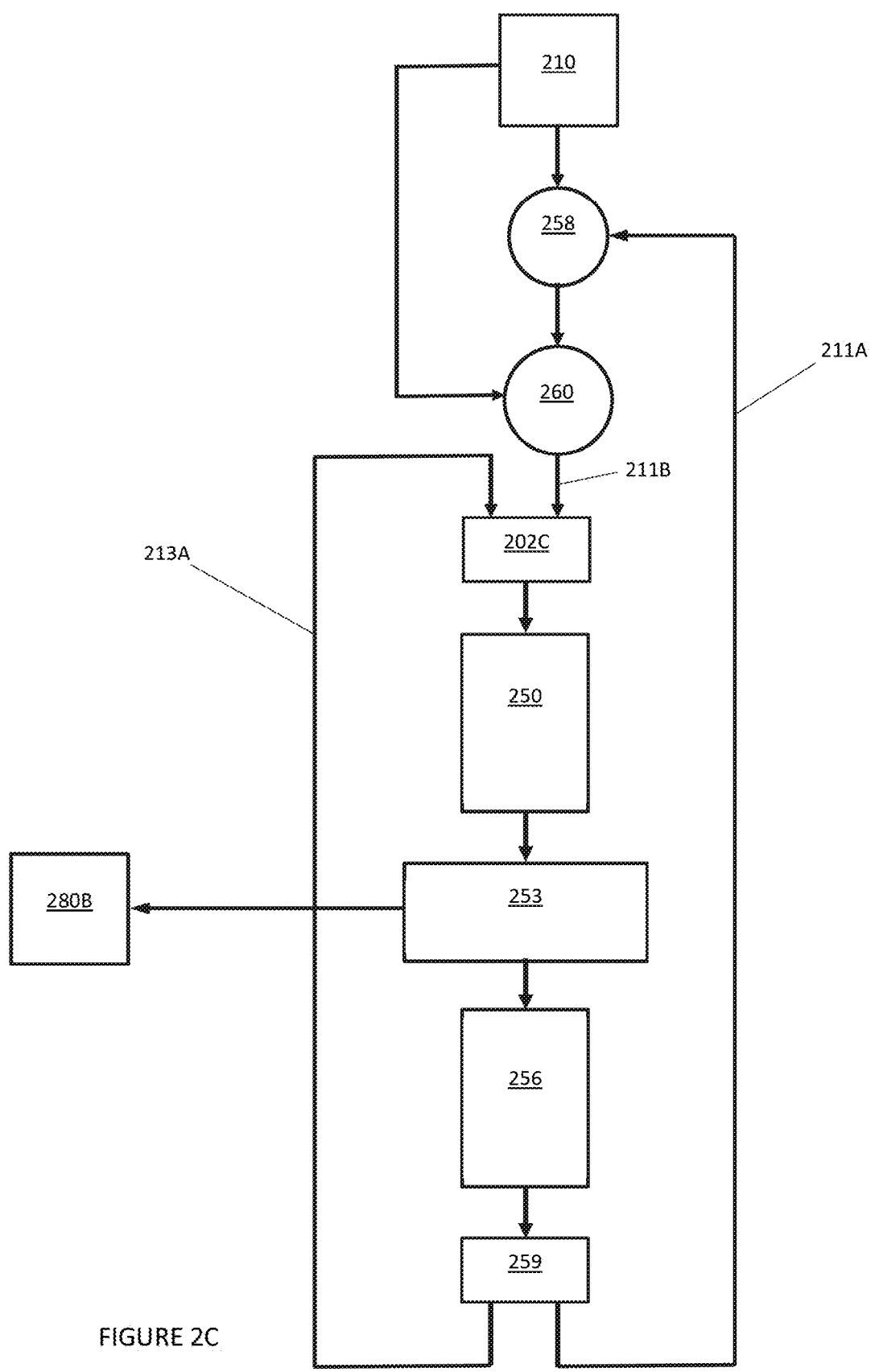
FIG. 2C illustrates alternative second and subsequent iterations of the example Gerchberg-Saxton type algorithm.

FIG. 2C represents an alternative embodiment of the second and subsequent iterations. The distribution of phase values 213A of the preceding iteration is fed-back through the processing blocks of the algorithm. The distribution of magnitude values 211A is rejected in favour of an alternative distribution of magnitude values. In this alternative embodiment, the alternative distribution of magnitude values is derived from the distribution of magnitude values 211 of the previous iteration. Specifically, processing block 258 subtracts the distribution of magnitude values of the input image 210 from the distribution of magnitude values 211 of the previous iteration, scales that difference by a gain factor α and subtracts the scaled difference from the input image 210. This is expressed mathematically by the following equations, wherein the subscript text and numbers indicate the iteration number:

$$R_{n+1}[x,y]=F'\{\exp(i\psi_n[u,v])\}$$

$$\psi_n[u,v]=\angle F\{\eta \cdot \exp(i\angle R_n[x,y])\}$$

$$\eta=T[x,y]-\alpha(|R_n[x,y]|-T[x,y])$$

where:
F' is the inverse Fourier transform;
F is the forward Fourier transform;
R[x, y] is the complex data set output by the third processing block 256;
T[x, y] is the input or target image;
∠ is the phase component;
Ψ is the phase-only hologram 280B;
η is the new distribution of magnitude values 211B; and
α is the gain factor.

The gain factor α may be fixed or variable. In some embodiments, the gain factor α is determined based on the size and rate of the incoming target image data. In some embodiments, the gain factor α is dependent on the iteration number. In some embodiments, the gain factor α is solely function of the iteration number.

The embodiment of FIG. 2C is the same as that of FIG. 2A and FIG. 2B in all other respects. It may be said that the phase-only hologram Ψ(u, v) comprises a phase distribution in the frequency or Fourier domain.

In some embodiments, the Fourier transform is performed using the spatial light modulator. Specifically, the hologram data is combined with second data providing optical power. That is, the data written to the spatial light modulation comprises hologram data representing the object and lens data representative of a lens. When displayed on a spatial light modulator and illuminated with light, the lens data emulates a physical lens—that is, it brings light to a focus in the same way as the corresponding physical optic. The lens data therefore provides optical, or focusing, power. In these embodiments, the physical Fourier transform lens 120 of FIG. 1 may be omitted. It is known how to calculate data representative of a lens. The data representative of a lens may be referred to as a software lens. For example, a phase-only lens may be formed by calculating the phase delay caused by each point of the lens owing to its refractive index and spatially-variant optical path length. For example, the optical path length at the centre of a convex lens is greater than the optical path length at the edges of the lens. An amplitude-only lens may be formed by a Fresnel zone plate. It is also known in the art of computer-generated holography how to combine data representative of a lens with a hologram so that a Fourier transform of the hologram can be performed without the need for a physical Fourier lens. In some embodiments, lensing data is combined with the hologram by simple addition such as simple vector addition. In some embodiments, a physical lens is used in conjunction with a software lens to perform the Fourier transform. Alternatively, in other embodiments, the Fourier transform lens is omitted altogether such that the holographic reconstruction takes place in the far-field. In further embodiments, the hologram may be combined in the same way with grating data—that is, data arranged to perform the function of a grating such as image steering. Again, it is known in the field how to calculate such data. For example, a phase-only grating may be formed by modelling the phase delay caused by each point on the surface of a blazed grating. An amplitude-only grating may be simply superimposed with an amplitude-only hologram to provide angular steering of the holographic reconstruction. The second data providing lensing and/or steering may be referred to as a light processing function or light processing pattern to distinguish from the hologram data which may be referred to as an image forming function or image forming pattern.

In some embodiments, the Fourier transform is performed jointly by a physical Fourier transform lens and a software lens. That is, some optical power which contributes to the Fourier transform is provided by a software lens and the rest of the optical power which contributes to the Fourier transform is provided by a physical optic or optics.

In some embodiments, there is provided a real-time engine arranged to receive image data and calculate holograms in real-time using the algorithm. In some embodiments, the image data is a video comprising a sequence of image frames. In other embodiments, the holograms are pre-calculated, stored in computer memory and recalled as needed for display on a SLM. That is, in some embodiments, there is provided a repository of predetermined holograms.

Embodiments relate to Fourier holography and Gerchberg-Saxton type algorithms by way of example only. The present disclosure is equally applicable to Fresnel holography and Fresnel holograms which may be calculated by a similar method. The present disclosure is also applicable to holograms calculated by other techniques such as those based on point cloud methods.

Light Modulation

A spatial light modulator may be used to display the diffractive pattern including the computer-generated hologram. If the hologram is a phase-only hologram, a spatial light modulator which modulates phase is required. If the hologram is a fully-complex hologram, a spatial light modulator which modulates phase and amplitude may be used or a first spatial light modulator which modulates phase and a second spatial light modulator which modulates amplitude may be used.

In some embodiments, the light-modulating elements (i.e. the pixels) of the spatial light modulator are cells containing liquid crystal. That is, in some embodiments, the spatial light modulator is a liquid crystal device in which the optically-active component is the liquid crystal. Each liquid crystal cell is configured to selectively-provide a plurality of light modulation levels. That is, each liquid crystal cell is configured at any one time to operate at one light modulation level selected from a plurality of possible light modulation levels. Each liquid crystal cell is dynamically-reconfigurable to a different light modulation level from the plurality of light modulation levels. In some embodiments, the spatial light modulator is a reflective liquid crystal on silicon (LCOS) spatial light modulator but the present disclosure is not restricted to this type of spatial light modulator.

A LCOS device provides a dense array of light modulating elements, or pixels, within a small aperture (e.g. a few centimetres in width). The pixels are typically approximately 10 microns or less which results in a diffraction angle of a few degrees meaning that the optical system can be compact. It is easier to adequately illuminate the small aperture of a LCOS SLM than it is the larger aperture of other liquid crystal devices. An LCOS device is typically reflective which means that the circuitry which drives the pixels of a LCOS SLM can be buried under the reflective surface. The results in a higher aperture ratio. In other words, the pixels are closely packed meaning there is very little dead space between the pixels. This is advantageous because it reduces the optical noise in the replay field. A LCOS SLM uses a silicon backplane which has the advantage that the pixels are optically flat. This is particularly important for a phase modulating device.

Figure 3:
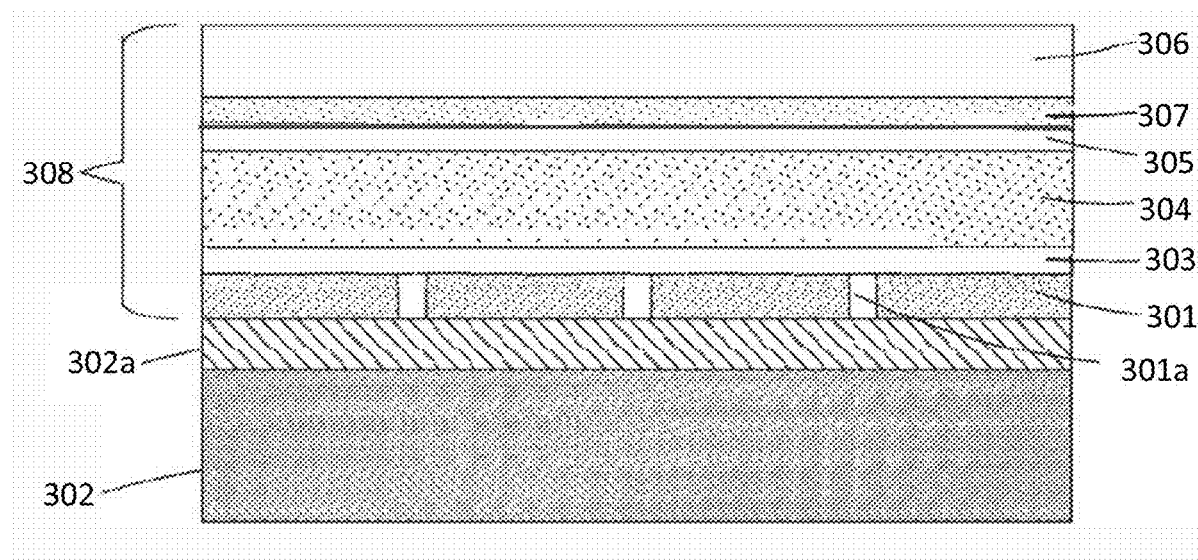
FIG. 3 is a schematic of a reflective LCOS SLM.

A suitable LCOS SLM is described below, by way of example only, with reference to FIG. 3. An LCOS device is formed using a single crystal silicon substrate 302. It has a 2D array of square planar aluminium electrodes 301, spaced apart by a gap 301a, arranged on the upper surface of the substrate. Each of the electrodes 301 can be addressed via circuitry 302a buried in the substrate 302. Each of the electrodes forms a respective planar mirror. An alignment layer 303 is disposed on the array of electrodes, and a liquid crystal layer 304 is disposed on the alignment layer 303. A second alignment layer 305 is disposed on the planar transparent layer 306, e.g. of glass. A single transparent electrode 307 e.g. of ITO is disposed between the transparent layer 306 and the second alignment layer 305.

Each of the square electrodes 301 defines, together with the overlying region of the transparent electrode 307 and the intervening liquid crystal material, a controllable phase-modulating element 308, often referred to as a pixel. The effective pixel area, or fill factor, is the percentage of the total pixel which is optically active, taking into account the space between pixels 301a. By control of the voltage applied to each electrode 301 with respect to the transparent electrode 307, the properties of the liquid crystal material of the respective phase modulating element may be varied, thereby to provide a variable delay to light incident thereon. The effect is to provide phase-only modulation to the wavefront, i.e. no amplitude effect occurs.

The described LCOS SLM outputs spatially modulated light in reflection. Reflective LCOS SLMs have the advantage that the signal lines, gate lines and transistors are below the mirrored surface, which results in high fill factors (typically greater than 90%) and high resolutions. Another advantage of using a reflective LCOS spatial light modulator is that the liquid crystal layer can be half the thickness than would be necessary if a transmissive device were used. This greatly improves the switching speed of the liquid crystal (a key advantage for the projection of moving video images). However, the teachings of the present disclosure may equally be implemented using a transmissive LCOS SLM.

Provision of Pixel Position Values

As described above, a hologram may be combined with one or more other diffractive patterns, such as a diffractive pattern functioning as a software lens or a software grating, to provide combined data for display on a spatial light modulator (SLM), for example an LCOS SLM. Such diffractive patterns may also (or instead) be referred to as 'light processing functions' or 'light processing patterns'.

For example, a diffractive pattern that functions as a grating may be combined with a hologram to translate the replay field on the replay plane or a diffractive pattern that functions as a lens may be combined with a hologram to focus the holographic reconstruction on a replay plane in the near field. Diffractive patterns such as gratings and lenses may be represented by respective software functions, wherein each pixel of the spatial light modulator may have a corresponding value of the software function. The skilled reader will be familiar with the use of software function values $F(x)$, for representing diffractive patterns on the pixels of a spatial light modulator.

For diffractive patterns such as a software lens or a grating function, each value on the SLM (or other suitable pixelated display device) is a function of both the 'x' coordinate and the 'y' coordinate of the respective pixel to which the software value will be written. As the skilled reader will be aware, it is usual for a processing block (such as a processor or logic device or logic circuit) to calculate the software function values for the pixels of the SLM each time a software function is to be written thereto, rather than, for example, reading them from memory. Such calculations will require the values of each pixel's position coordinate. Moreover, the pixel position values often need to be supplied to a suitable processing block, for calculation of corresponding software function values, on a dynamic basis.

As will be familiar to the skilled reader, the pixel positions in an SLM may be expressed by (x,y) coordinates. If the size, in terms of number of pixels, of the SLM along the x axis is referred to simply as 'x', then the 'x' parts (or x components) of the pixel position values will be a sequential stream, starting at 0, going up to 'x−1', for each row. The x components of the software function values, calculated from the stream of x values, may be denoted by $F(x)$.

Similarly, if the size, in terms of number of pixels, of the SLM along the y axis is referred to simply as 'y', then the 'y' part of the pixel position values will be a sequential stream, starting at 0, going up to 'y−1', for each column. The y components of the software function values, calculated from the stream of y values, may be denoted by $F(y)$.

As the skilled reader will also be aware, the size of an SLM may also (or instead) be referred to using matrix notation, with an [m×n] SLM having 'm' rows and 'n' columns. Using this notation, each row would have 'n' pixels therein. Therefore the 'row' part of the pixel position values will be a sequential stream, starting at 0, going up to 'n−1', for each row. Similarly, using this notation, each column would have 'm' pixels therein. Therefore the 'column' part of the pixel position values will be a sequential stream, starting at 0, going up to 'm−1', for each column.

An SLM will typically have an operational speed, or rate, at which it requires (or demands) values for the data that is to be displayed thereon. In other words, an SLM will typically demand a predetermined number of data values per clock cycle (of the SLM). For example, an SLM may be configured to display a dynamic sequence (or dynamic plurality) of holograms, some or all of which may have to be provided in combination with a software function or functions. In some cases, the holograms themselves and/or the software functions that should accompany them are calculated on a dynamic basis, for example in order to display holograms corresponding to captured images on a substantially real-time basis. In order to achieve this, an SLM should be supplied with its required data streams on a dynamic basis, at a suitable rate (or speed).

For software function calculation, an SLM—or a processing block that is arranged to perform software function calculation for the SLM—should be supplied with a datastream of pixel position values on a dynamic basis, to enable the calculations to be performed at a rate which meets the SLM's demand. The datastream of pixel position values may be fed into a data pipeline, which is effectively a queue of data that is 'waiting' to be fed to the SLM (or to a suitable processing block) and that is dynamically updated, to keep the queued data fresh, for use by the SLM, or by the next processing block in a chain.

If an SLM cannot be supplied with data quickly enough, the system within which it is comprised will be forced to either under-use the SLM and/or to slow down the system's overall rate of operation. This is inefficient and generally undesirable. For example, the SLM may part of a real-time holographic system, arranged to produce holographic reconstructions of images captured on a real-time basis. For example, this could form part of a heads-up display (HUD), for example as part of a navigation system in a vehicle. In such an arrangement, it may be safety-critical for the SLM to work at a particular speed. Therefore, a suitable datastream must be dynamically fed to the SLM, in order to enable it to work at that speed.

Returning to the creation of a datastream; for each row of an SLM that has 'x' pixels per row, the 'x' parts of the pixel position values comprise a sequential stream of whole integers, starting from zero and going up to (x−1). Conventionally, a processing block such as logic device or logic circuit—for example, an integrated circuit, comprising an FPGA or ASIC—that requires a stream of consecutive values would obtain them from an adder unit (or 'unity addition module'). As the skilled reader will be aware, an adder unit typically comprises a plurality of logic gates, for example a combination of OR, XOR, and AND logic gates, which can be arranged and controlled to supply numbers on a cyclical basis, adding one (1) to its immediately previously-supplied number, for every operational cycle (or 'clock cycle'), in order to provide a stream of sequential numbers. This generally provides a reliable stream of consecutive numbers, that could represent the 'x' parts of the pixel position values (or, indeed, the 'y' parts of the pixel position values). However, the rate at which those pixel position values can be supplied is determined by the operational cycling rate (or 'clock speed') of the unity adder. As the skilled reader will appreciate, an adder unit will typically be comprised within an integrated circuit, such as an FPGA or ASIC, and the clock speed of the adder unit will depend on the clock speed of the integrated circuit.

A pixelated device, such as an SLM, and a unity adder that supplies values to the pixelated display device, may have a common clock cycle. Nonetheless, in many embodiments, an SLM or other pixelated display device will be able, and may be required, to demand data for display thereon at a rate that is quicker than the typical cycling rate (or clock speed) of a unity adder. The SLM may therefore demand multiple pixel values, per operational cycle (or per 'clock cycle') of a typical unity adder. This leads to two main options—either the speed at which the data is provided to the SLM should be improved, or the operation of the SLM must be slowed down (or the SLM under-utilised). In many real-world scenarios, it will be impractical, inefficient, expensive and therefore undesirable to opt for slowing down or under utilising an SLM. Accordingly, it would be desirable to increase the rate at which data can be provided to an SLM.

The present inventors have identified a solution that increases the rate at which data can be provided to a pixelated display device, such as an SLM, for example an LCOS.

The solution identified by the present inventors comprises using a single unity adder with a plurality of pipelines (or 'pipeline modules'), wherein the rate at which numbers are provided by the unity adder is effectively 'scaled up' (i.e. multiplied) by a number equal to the number of pipelines that are provided to work in conjunction with the unity adder. As a result, it is possible to provide data at a quicker rate, to a pixelated display device such as an SLM, or to another device or circuit that carries out data calculation for the pixelated display device. This is achieved by harnessing the features of binary numbers and employing parallel operation of the pipeline modules, as detailed below.

Figure 4:
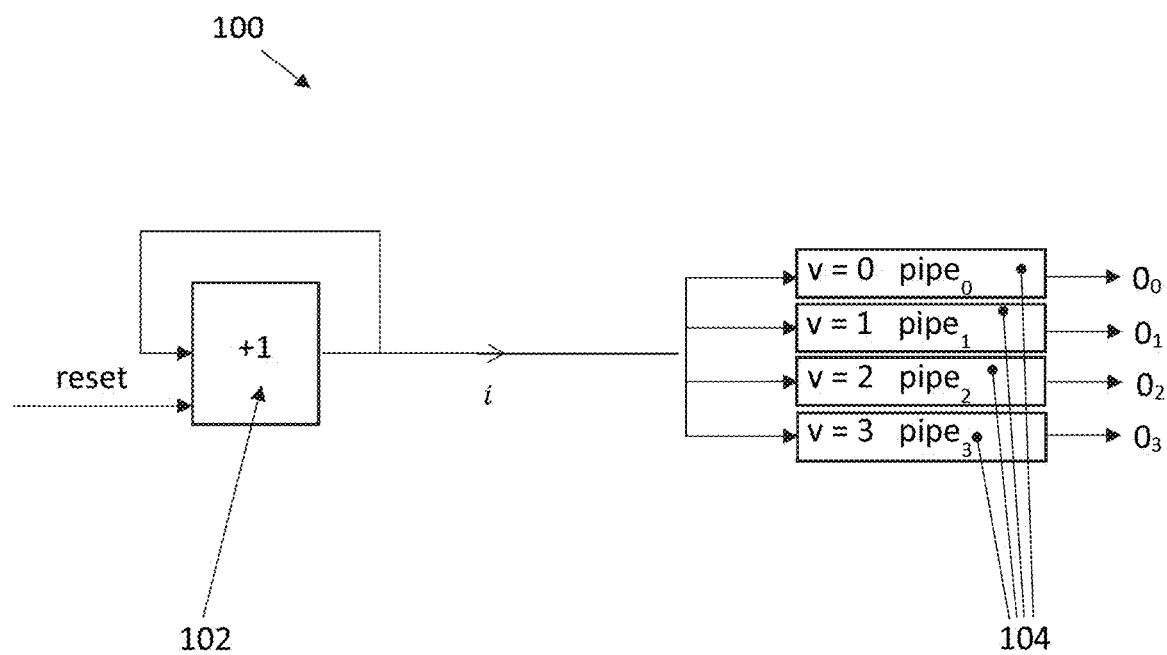
FIG. 4 is a schematic of a logic circuit, in accordance with embodiments.

FIG. 4 shows an example of a logic circuit 100 that may be used to increase the rate at which data can be provided to a pixelated display device, such as an SLM (not itself shown). The logic circuit 100 may be comprised within a logic device, which may comprise one or more additional processing blocks such as logic circuits. The logic circuit 100 may be comprised within an integrated circuit such as an FPGA or ASIC. The logic circuit 100 may feed data to an SLM or other pixelated display device, or to another logic circuit or logic device or processor. For example, it may feed data to a second logic circuit within a common integrated circuit such as an FPGA, wherein the second logic circuit is arranged to calculate software function values, using a sequence of pixel position values that have been provided to it by the logic circuit 100 of FIG. 4.

The logic circuit 100 is arranged to provide an output comprising batches (or groups) of sequential numbers, in binary form. In this example, the logic circuit is arranged to output the sequential numbers in batches (or groups) of four numbers at a time, with the first number (i.e. the lowest number) in each batch leading sequentially on from the fourth number (i.e. the highest number) that was output in the respective previous batch.

The logic circuit 100 comprises a unity addition module (or 'unity adder') 102 and a plurality (p) comprising four pipeline modules 104, labelled and referred to herein as $pipe_0$, $pipe_1$, $pipe_2$, and $pipe_3$, respectively. The pipeline modules 104 are shown in FIG. 4 as parallel entities. This is not necessarily representative of a physical structure but is representative of them operating substantially in parallel with one another, as detailed further below. Each pipeline module 104 comprises an independent electrical conduit, arranged for numbering (and/or other data) processing.

The unity adder 102 is arranged to be controlled by a suitable controller (not shown), wherein the controller will be arranged to provide a 'reset' signal to the unity adder 102, after a suitable number of clock cycles. As the skilled reader will be aware, the frequency with which the unity adder 102 should be reset will be dependent on a variety of factors such as, for example, the size of the pixelated display device for which it is supplying values.

The unity adder 102 is arranged to output a number, i, in multi-bit binary form, and to transmit it to the plurality (p) (or 'group') of pipeline modules 104, wherein each pipeline module 104 within the plurality (p) of pipeline modules is arranged to receive the same number, i, from the unity adder 102 at substantially the same time as the respective others. In the particular example shown in FIGS. 4 and 5 herein, the plurality (p) comprises 4 pipeline modules, but other numbers of pipeline modules are also contemplated. The unity adder 102 is arranged to work on a cyclical basis, wherein it repeats its operation each cycle (i.e. each 'clock cycle'), increasing the output number, i, by one (1) each cycle, and transmitting it to the pipeline modules 104, in parallel with one another.

In the logic circuit 100 of FIG. 4, the numbers output by the unity adder 102 are not used directly as pixel position values. Instead, each pipeline 104 is assigned an individual pipeline identity value, v, (or a 'significance number'), in binary form, and each pipeline 104 is arranged to append its individual pipeline identity value, v, to the number, i, received from the unity adder 102, each operational cycle. The resultant multi-bit numbers, $o_v$, are output from the pipeline modules 104, for use as pixel position values for the SLM.

To achieve this, each pipeline's individual pipeline identity value, v, indicates its unique position, or 'significance', within the plurality, (p), of pipelines, and is related to the pixel position for which it outputs a pixel position number on a first cycle of operation. This can be seen and better understood in relation to FIG. 5. In this case, $pipe_0$ is the pipeline module which outputs the pixel position value for the first pixel in a row—i.e. it outputs 'x=0'. Its individual pipeline identity value, v is therefore equal to zero (0). It is therefore assigned a two-bit binary identity representing zero, i.e. '00'. In turn; $pipe_1$ is the pipeline module which outputs the pixel position value for the second pixel in a row—i.e. it outputs 'x=1'. Its individual pipeline identity value, v is therefore equal to one (1). It is therefore assigned a two-bit binary identity representing one, i.e. '01'. Moving on; $pipe_2$ is the pipeline module which outputs the pixel position value for the third pixel in a row—i.e. it outputs 'x=2'. Its individual pipeline identity value, v is therefore equal to two (2). It is therefore assigned a two-bit binary identity representing two, i.e. '10'. Finally; $pipe_3$ is the pipeline module which outputs the pixel position value for the fourth pixel in a row—i.e. it outputs 'x=3'. Its individual pipeline identity value, v is therefore equal to three (3). It is therefore assigned a two-bit binary identity representing three, i.e. '11'.

For each cycle of operation, the parallel incoming instances of the multi-bit number, i, from the unity adder 102, are concatenated with the individual significance (or identity) number of each pipeline module 104, wherein the pipeline significance is expressed in the least significant bits of the resultant multi-bit binary number. That is; the binary number, v, representing of each pipeline module's respective identity, or significance, is added to the end of the incoming number, i, from the unity adder 102. Each pipeline module 104 can then output its unique resultant number, $o_v$. This should preferably be done by all the pipeline modules 104 substantially simultaneously.

Figure 5:
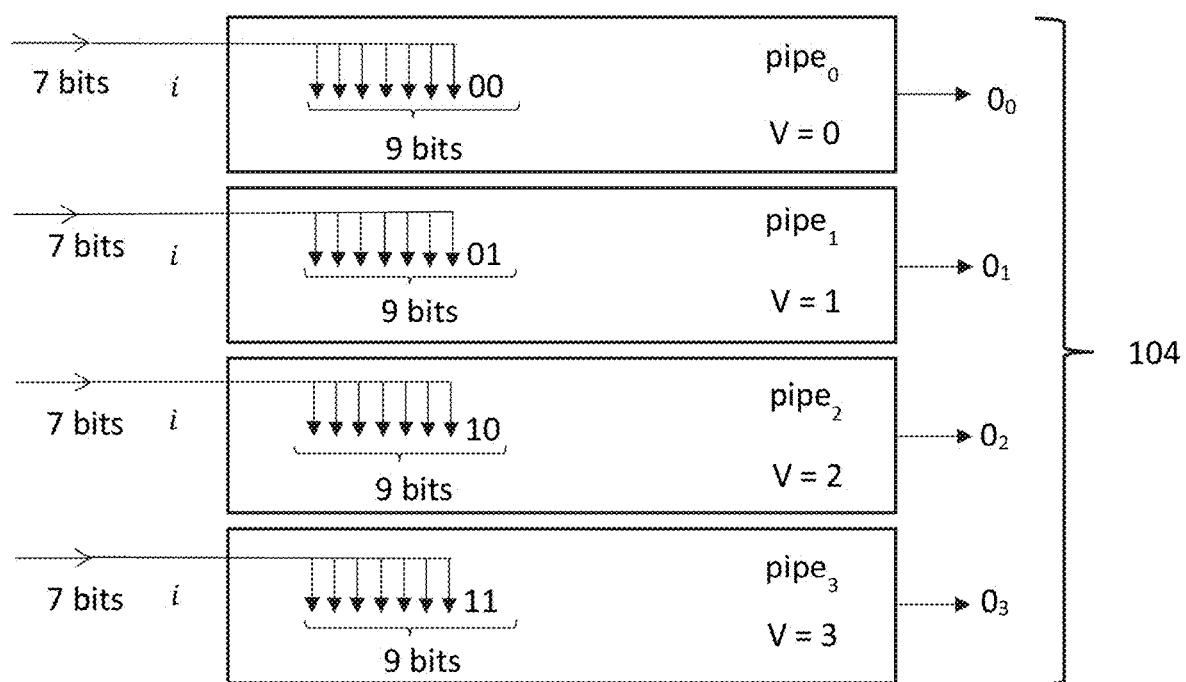
FIG. 5 is a schematic of the pipeline modules of FIG. 4, according to an embodiment.

In the example shown in FIG. 5, the number, i, received at the pipeline modules 104 from the unity adder 102, comprises 7 bits. This is an example only and should not be regarded as limiting. Any suitable number of bits may be comprised in the numbers, i, which are output by the unity adder 102. The number of bits that are required, within each multi-bit number, i, output by the unity adder 102, may be determined by the number of pixel position values (or, by the number of 'x' components of pixel position values) that are required for a row of the SLM. That is; if the SLM comprises an array of pixels that has 'm' rows and 'n' columns, there will be 'n' pixels in each row. The 'x' part of the pixel position value for each row will begin at 0 and will increase sequentially (by a whole integer), from one pixel to the respective next pixel, up until a value of (n−1). Therefore, the unity adder 102 will be required to output binary numbers which have a sufficient numbers of bits to, when concatenated by the pipeline modules' individual pipeline identity value, v, result in values, $o_v$, being output by the pipeline modules, in binary form, ranging from 0 to 'n−1', for use as pixel position values for the SLM.

In the particular example illustrated in FIGS. 4 and 5, the multi-bit number from the unity adder 102 is 7-bits long, and the individual pipeline identity value, v, for each pipeline module 104 is represented by a 2-bit binary number. Therefore, the resultant numbers are 9-bits long. This is just an example and should not be regarded as limiting. The number of bits used to represent the individual pipeline identity values, v, may be different—for example, based on the number of pipeline modules 104 in a plurality (p) of pipeline modules. However, as mentioned above, the number of bits in the incoming numbers from the unity adder 102 should be large enough to ensure that, when the pipeline significance numbers are appended thereto, the resultant numbers, $o_v$, have enough bits to represent all of the pixel position values that are required for a row.

For example, returning to FIG. 5; the number of columns 'n' in the SLM array may be five hundred and twelve (512). The 'x' part of the pixel position values will therefore have to go from zero (0) to five hundred and eleven (511). The number '511' is represented in binary form by nine '1's, i.e. it is 111 111 111. Therefore, for this example, where there are 4 pipelines, with 2-bit significance numbers, the incoming numbers from the unity adder 102 must have 7 bits, to accommodate the creation of all the pixel position values that are required for a row, from 0 to 511.

If there were a different number of pipelines 104, to which the unity adder 102 supplied its numbers, the number of bits in the numbers supplied by the unity adder 102 could be different from the particular example shown in FIGS. 4 and 5. Similarly, if the SLM array was bigger or smaller than the one in the particular example shown in FIGS. 4 and 5, this could change the number of bits required in the numbers supplied by the unity adder 102.

For example, if there were 8 pipeline modules, the individual pipeline identity values, v, (or 'significance numbers') for those pipeline modules would have values ranging from 'v=0' to 'v=7' and thus their binary representations would each need to have 3 bits, because 7=111 in binary form. The binary pipeline significance values in such an example would be as follows: 000, 001, 010, 011, 100, 101, 110, and 111. Therefore, if those 8 pipelines were supplying pixel position values for an SLM having 512 columns, and thus having a highest 'x' position value in each row of 511, it would be permissible for the incoming numbers from the unity adder 102 to have 6 bits, because the resultant numbers, $o_v$, when the significance numbers, v, of the pipelines were appended thereto, would have 9 bits.

By way of another example, FIG. 6 comprises a table showing the inputs (from a unity adder) and the outputs from the 4 pipeline modules 104 of the logic circuit 100, if a smaller SLM array was to be furnished with a stream of pixel position values. The process in this example comprises 8 operational cycles of the unity adder. As the skilled reader will appreciate; the number of operational cycles that are required, to furnish an SLM or processing block with the requisite number of pixel position values, will depend on the size of the SLM array and on the number of pipeline modules—more pipeline modules will produce correspondingly more pixel position values, per operational cycle. In this example, the SLM has 32 pixels per row. This means that the highest 'x' component of the pixel position value, per row, is 31, which is '11111' in binary form. This means that the numbers output from the pipeline modules 104 must be 5 bits long. In this example, each pipeline module 104 has a 2-bit individual pipeline identity value, v, (or 'significance number'), therefore the numbers supplied by the unity adder need to be 3 bits long.

Regardless of how many bits are comprised therein, the resultant multi-bit numbers, which are output from the pipeline modules 104, comprise a sequence of numbers. Moreover, each sequence of output numbers follows on directly from the immediately previously output sequence. This can be seen and understood from FIG. 6. For example, for the first cycle of operation, the sequence of output numbers from the pipeline modules in FIG. 6 comprises a binary representation of zero, one, two and three, which are the required pixel position values for the 'x' components of the first four pixels in a row of the SLM. For the second cycle, in which the number provided by the unity adder has increased by 1, the resultant numbers, when the significance values of the pipeline modules have been appended to the number from the unity adder, continue the sequence exactly where the first group finished. That is; the lowest binary number in the second batch of numbers, output from the pipeline modules in the second cycle of operation, is one (1) higher than the highest number that was previously output in the first batch of numbers, output from the pipeline modules in the first cycle of operation. It follows therefore, in this example, that the second batch of output numbers can be used as pixel position values for the fifth to eight pixels in the row. As can be seen from FIG. 6, each batch of numbers follows directly on from the respective previous one, up until the maximum pixel position value is reached, with the highest number in the final cycle of operation, in this example.

The present inventors have recognised that, due to the properties of binary numbers, the approach described above in relation to FIGS. 4 to 6 can be adopted for any size of array, for which pixel position values—or a stream of sequential numbers, for any other purpose are to be provided. Moreover, any suitable number of pipeline modules may be provided—for example, 4, 8, or 16 pipeline modules may be used. Therefore, a plurality of (e.g. 4, 8 or 16) pixel position values can be delivered to an SLM, or to another processing block that makes a calculation for the SLM—for example, a calculation of software function values—at the same time as one another. Thus, multiple pixel position values can be output by the logic circuit 100 for every operational cycle of the logic circuit 100, thus satisfying an SLM's demand for a high speed of operation, whilst still using a single conventional unity adder. As the skilled reader will appreciate, it is preferable to have multiple pipeline modules and just one unity adder, as opposed to having multiple unity adders, because it reduces the number of logic gates within the logic circuit 100. Therefore, the logic circuit is more streamlined and efficient, both structurally and computationally.

The logic circuit 100 can enable the fast production of a stream of sequential values, for use by an SLM or by another processing block, yet no single entity within the logic circuit 100 has to work unrealistically quickly, not or is any entity within the logic circuit 100 overburdened with computational tasks. That is; for each cycle of its operation, the unity adder 102 needs only to output one number, and it does not have to work at an accelerated speed. Moreover, within the system of pipeline modules 104, each pipeline module 104 only needs to calculate one value, by appending its individual pipeline identity value, v (or 'significance number') to the incoming number from the unity adder 102, per operational cycle. However, because a plurality of pipeline modules can work in parallel with one another, the logic circuit 100 as a whole is able to produce a plurality of output numbers, for use as a stream of pixel position values for an SLM, for every operational cycle of the unity adder 102.

The logic circuit described herein provides enhanced efficiency and enables high-speed production of a data stream of sequential numbers, using a low number of entities. For example, only one unity adder is required, in the logic circuit. This is advantageous in many embodiments, in which physical and computation efficiency and cost-saving are important. For example, in holographic arrangements having multiple wavelength channels, such as red, green and blue channels, each with a corresponding SLM, every circuit that is needed for one SLM usually has to be replicated for the two respective others. In such an arrangement, therefore, any improvement in efficiency or cost saving for a single SLM has a three-fold effect on efficiency and cost saving for the overall system. Moreover, with the logic circuit described herein, we can also rescue the number of bits that are used in the addition.

The logic circuit as described herein can be used to provide a stream of sequential numbers to an SLM or to any suitable processing block, such as a processor, another logic circuit or a logic device. It can provide a stream of pixel position values to a processing block that is arranged to process software function values, for the corresponding pixels of an SLM, on a dynamic basis. For example, the SLM may be comprised within a holography system such as a real-time holographic projector.

The processes described above can be repeated for the provision of pixel position values for multiple rows of an SLM.

An SLM for which the logic circuit provides pixel position values may be arranged to perform raster scanning, which is a scanning technique that the skilled reader will be familiar with. In such an arrangement, the logic circuit may therefore be arranged to provide pixel position values for pixels in a left-to-right, top row to bottom row, manner. However other arrangements are also contemplated.

Although the examples given above have focused on the creation of the 'x' components of pixel position values, the described processes can equally be applied to the creation of the 'y' components of pixel position values, for a column or columns of a pixelated display device such as an SLM. For example, an SLM may demand pixel values on a column-by-column basis, rather than on a row-by-row basis.

In some arrangements, an integrated circuit that supplies software function values to a pixelated display device, such as an SLM, will comprise an 'x' logic circuit and a 'y' logic circuit, that can be summed together. The skilled reader will be familiar with techniques for summing together logic circuits.

For an arrangement in which the 'x' pixel position values are calculated, the y-value is the same for every pixel position of each particular row. The y-value in such an example will only increment at the end of each row. Therefore, it would not be necessary, in such an arrangement, to generate multiple y-values per clock cycle, in order to meet the demands of the SLM.

A logic device (e.g. field-programmable gate array, "FPGA") can be provided, comprising the logic circuit. The logic circuit in accordance with this disclosure is particularly suitable for implementation in an FPGA. The logic circuit in accordance with this disclosure may also be implemented in another type of programmable logic device, "PLD", or in an application specific integrated circuit, "ASIC" or similar custom layout logic device.

A holographic projector can also be provided, comprising the logic device (e.g. FPGA), a pixelated display device and a light source. The pixelated display device—e.g. a spatial light modulator such as a liquid crystal on silicon spatial light modulator—is arranged to display a light modulation pattern comprising a software function that has been calculated using pixel position values, generated by the logic circuit described herein. The light source is arranged to illuminate the software function, which may be provided in combination with one or more holograms, with light having a wavelength, $\lambda$.

The logic device (e.g. FPGA) may be further arranged to add the calculated software function values to hologram pixel values of a stream of hologram pixel values to form a data stream of display values. The light modulation pattern is formed in accordance with the stream of display values provided to the pixelated display device by the field programmable gate array.

A head-up display may be provided, comprising the holographic projector.

A method is also provided herein of streaming pixel position values for calculation of corresponding software function values, for display on [m×n] pixels of a pixelated display device, as detailed above.

Additional Features

Embodiments refer to an electrically-activated LCOS spatial light modulator by way of example only. The teachings of the present disclosure may equally be implemented on any spatial light modulator capable of displaying a computer-generated hologram in accordance with the present disclosure such as any electrically-activated SLMs, optically-activated SLM, digital micromirror device or microelectromechanical device, for example.

In some embodiments, the light source is a laser such as a laser diode. In some embodiments, the detector is a photodetector such as a photodiode. In some embodiments, the light receiving surface is a diffuser surface or screen such as a diffuser. The holographic projection system of the present disclosure may be used to provide an improved head-up display (HUD). In some embodiments, there is provided a vehicle comprising the holographic projection system installed in the vehicle to provide a HUD. The vehicle may be an automotive vehicle such as a car, truck, van, lorry, motorcycle, train, airplane, boat, or ship.

The quality of the holographic reconstruction may be affect by the so-called zero order problem which is a consequence of the diffractive nature of using a pixelated spatial light modulator. Such zero-order light can be regarded as "noise" and includes for example specularly reflected light, and other unwanted light from the SLM.

In the example of Fourier holography, this "noise" is focussed at the focal point of the Fourier lens leading to a bright spot at the centre of the holographic reconstruction. The zero order light may be simply blocked out however this would mean replacing the bright spot with a dark spot. Some embodiments include an angularly selective filter to remove only the collimated rays of the zero order. Embodiments also include the method of managing the zero-order described in European patent 2,030,072, which is hereby incorporated in its entirety by reference.

In some embodiments, the size (number of pixels in each direction) of the hologram is equal to the size of the spatial light modulator so that the hologram fills the spatial light modulator. That is, the hologram uses all the pixels of the spatial light modulator. In other embodiments, the hologram is smaller than the spatial light modulator. More specifically, the number of hologram pixels is less than the number of light-modulating pixels available on the spatial light modulator. In some of these other embodiments, part of the hologram (that is, a continuous subset of the pixels of the hologram) is repeated in the unused pixels. This technique may be referred to as "tiling" wherein the surface area of the spatial light modulator is divided up into a number of "tiles", each of which represents at least a subset of the hologram. Each tile is therefore of a smaller size than the spatial light modulator. In some embodiments, the technique of "tiling" is implemented to increase image quality. Specifically, some embodiments implement the technique of tiling to minimise the size of the image pixels whilst maximising the amount of signal content going into the holographic reconstruction. In some embodiments, the holographic pattern written to the spatial light modulator comprises at least one whole tile (that is, the complete hologram) and at least one fraction of a tile (that is, a continuous subset of pixels of the hologram).

In embodiments, only the primary replay field is utilised and system comprises physical blocks, such as baffles, arranged to restrict the propagation of the higher order replay fields through the system.

In embodiments, the holographic reconstruction is colour. In some embodiments, an approach known as spatially-separated colours, "SSC", is used to provide colour holographic reconstruction. In other embodiments, an approach known as frame sequential colour, "FSC", is used.

The method of SSC uses three spatially-separated arrays of light-modulating pixels for the three single-colour holograms. An advantage of the SSC method is that the image can be very bright because all three holographic reconstructions may be formed at the same time. However, if due to space limitations, the three spatially-separated arrays of light-modulating pixels are provided on a common SLM, the quality of each single-colour image is sub-optimal because only a subset of the available light-modulating pixels is used for each colour. Accordingly, a relatively low-resolution colour image is provided.

The method of FSC can use all pixels of a common spatial light modulator to display the three single-colour holograms in sequence. The single-colour reconstructions are cycled (e.g. red, green, blue, red, green, blue, etc.) fast enough such that a human viewer perceives a polychromatic image from integration of the three single-colour images. An advantage of FSC is that the whole SLM is used for each colour. This means that the quality of the three colour images produced is optimal because all pixels of the SLM are used for each of the colour images. However, a disadvantage of the FSC method is that the brightness of the composite colour image is lower than with the SSC method—by a factor of about 3—because each single-colour illumination event can only occur for one third of the frame time. This drawback could potentially be addressed by overdriving the lasers, or by using more powerful lasers, but this requires more power resulting in higher costs and an increase in the size of the system.

Examples describe illuminating the SLM with visible light but the skilled person will understand that the light sources and SLM may equally be used to direct infrared or ultraviolet light, for example, as disclosed herein. For example, the skilled person will be aware of techniques for converting infrared and ultraviolet light into visible light for the purpose of providing the information to a user. For example, the present disclosure extends to using phosphors and/or quantum dot technology for this purpose.

Some embodiments describe 2D holographic reconstructions by way of example only. In other embodiments, the holographic reconstruction is a 3D holographic reconstruction. That is, in some embodiments, each computer-generated hologram forms a 3D holographic reconstruction.

The methods and processes described herein may be embodied on a computer-readable medium. The term "computer-readable medium" includes a medium arranged to store data temporarily or permanently such as random-access memory (RAM), read-only memory (ROM), buffer memory, flash memory, and cache memory. The term "computer-readable medium" shall also be taken to include any medium, or combination of multiple media, that is capable of storing instructions for execution by a machine such that the instructions, when executed by one or more processors, cause the machine to perform any one or more of the methodologies described herein, in whole or in part.

The term "computer-readable medium" also encompasses cloud-based storage systems. The term "computer-readable medium" includes, but is not limited to, one or more tangible and non-transitory data repositories (e.g., data volumes) in the example form of a solid-state memory chip, an optical disc, a magnetic disc, or any suitable combination thereof. In some example embodiments, the instructions for execution may be communicated by a carrier medium. Examples of such a carrier medium include a transient medium (e.g., a propagating signal that communicates instructions).

It will be apparent to those skilled in the art that various modifications and variations can be made without departing from the scope of the appended claims. The present disclosure covers all modifications and variations within the scope of the appended claims and their equivalents.

The invention claimed is:

1. A logic circuit arranged to output a stream of pixel position values, x, for a row of a pixelated display device, the pixelated display device having [m×n] pixels, for calculation of corresponding software function values, for display on the pixels of the row;
    wherein the stream comprises sequential numbers from 0 to (n−1); and
    wherein the logic circuit comprises
        a unity addition module arranged to provide a multi-bit binary input, i, to each of the plurality, p, of pipeline modules, in common, during a pre-defined time cycle; and
        a plurality, p, of pipeline modules, the pipeline modules having respective individual pipeline identity values, v, from v=0 to v=(p−1), wherein each pipeline module is arranged, for the pre-defined time cycle, to:
            receive the multi-bit binary input, i, from the unity addition module;
            append a binary representation of its individual pipeline identity value, v, to the received multi-bit binary input, i; and to
            output a unique multi-bit binary output, $o_v$, that comprises a combination of the received multi-bit binary input, i, and the binary representation of its individual pipeline identity value, v.

2. A logic circuit as claimed in claim 1 wherein the unique multi-bit binary output, $o_v$, from a pipeline module, for a pre-defined time cycle, comprises the received multi-bit binary input, i, as its most significant bits and the binary representation of the pipeline's individual pipeline identity value, v, as its least significant bit(s).

3. A logic circuit as claimed in claim 1 wherein the unity addition module is arranged to:

provide a first multi-bit binary input $i_1$ to each of the plurality, p, of pipeline modules during a first pre-defined time cycle; and provide a second multi-bit binary input $i_2$ to each of the plurality, p, of pipeline modules during a second pre-defined time cycle, immediately subsequent the first pre-defined time cycle, wherein the second multi-bit binary input $i_2$ is greater than the first multi-bit binary input $i_1$ by a single integer (1).

4. A logic circuit as claimed in claim 1, wherein each binary representation of an individual pipeline identity value, which identifies a corresponding pipeline module, has the same number of bits as each of the other binary representations of individual pipeline identity values, which identify the corresponding, respective other, pipeline modules.

5. A logic circuit as claimed in claim 1, wherein the logic circuit is arranged to output a stream of pixel position values, x, for a row of a pixelated display device that demands a pre-determined number, k, of pixel values per pre-defined time cycle, wherein k is a factor of the number of pipeline modules comprised within the plurality, p, of pipeline modules.

6. A logic circuit as claimed in claim 1, wherein each of the plurality, p, of pipeline modules is arranged to output its unique multi-bit binary output, $o_v$, for a pre-defined time cycle at substantially the same time as each of the respective other pipeline modules.

7. A logic circuit as claimed in claim 1, wherein the software function values F(x), for display on [n×m] pixels of a pixelated display device, comprise values of a lens function or a grating function.

8. A logic circuit as claimed in claim 7, wherein the lens function or grating function is provided for display in combination with a hologram on a pixelated display device.

9. A logic device comprising the logic circuit as claimed in claim 1, wherein the device comprises an application specific integrated circuit, ASIC, or a programmable logic device, PLD.

10. A logic device as claimed in claim 9, wherein the device comprises a programmable logic device that comprises a field programmable gate array, FPGA.

11. A holographic projector comprising:
the device of claim 9;
a pixelated display device arranged to display a light modulation pattern comprising the software function values F(x), calculated in accordance with the stream of pixel position values, x; and
a light source arranged to illuminate the light modulation pattern with light having a wavelength, I.

12. A holographic projector as claimed in claim 11, wherein the device is further arranged to add the software function values F(x), calculated in accordance with the stream of pixel position values, x, to hologram pixel values of a stream of hologram pixel values to form a data stream of display values, wherein the light modulation pattern is formed in accordance with the stream of display values provided to the pixelated display device by the logic device.

13. A head-up display comprising the holographic projector of claim 11.

14. A method of streaming pixel position values, x, for a row of a pixelated display device, the pixelated display device having [m×n] pixels, for calculation of corresponding software function values, for display on the pixels of the row, wherein the stream comprises sequential numbers from 0 to (n−1), the method comprising:

providing a multi-bit binary input, i, to each of a plurality, p, of pipeline modules, in common, during a pre-defined time cycle, wherein the pipeline modules have respective individual pipeline identity values, v, from v=0 to v=(p−1); and at each of the plurality, p, of pipeline modules, for the pre-defined time cycle:
receiving the multi-bit binary input, i;
appending a binary representation of its individual pipeline identity value, v, to the received multi-bit binary input, i; and
outputting a unique multi-bit binary output, $o_v$, that comprises a combination of the received multi-bit binary input, i, and the binary representation of its individual pipeline identity value, v.

15. The method of claim 14 further comprising receiving the unique multi-bit binary outputs, $o_v$, from each of the pipeline modules in the plurality, p, of pipeline modules, and using the received unique multi-bit binary outputs, $o_v$, as pixel position values, x, for a row of a pixelated display device, for use in calculation of corresponding software function values F(x), for display on [n×m] pixels of a pixelated display device.

16. A method for modulating light, the method comprising
providing software function values for display on a pixelated display device having [n×m] pixels by a method comprising streaming pixel position values, x, for a row of the pixelated display device, wherein the stream comprises sequential numbers from 0 to (n−1), the method comprising:
providing a multi-bit binary input, i, to each of a plurality, p, of pipeline modules, in common, during a pre-defined time cycle, wherein the pipeline modules have respective individual pipeline identity values, v, from v=0 to v=(p−1); and
at each of the plurality, p, of pipeline modules, for the pre-defined time cycle:
receiving the multi-bit binary input, i;
appending a binary representation of its individual pipeline identity value, v, to the received multi-bit binary input, i;
outputting a unique multi-bit binary output, $o_v$, that comprises a combination of the received multi-bit binary input, i, and the binary representation of its individual pipeline identity value, v; and
receiving the unique multi-bit binary outputs, $o_v$, from each of the pipeline modules in the plurality, p, of pipeline modules, and using the received unique multi-bit binary outputs, $o_v$, as pixel position values, x, for a row of a pixelated display device;
displaying on the pixelated display device a light modulation pattern comprising the software function values F(x), calculated in accordance with the stream of pixel position values, x; and
illuminate the light modulation pattern with light having a wavelength, I, from a light source, thereby providing modulated light.

* * * * *